United States Patent
Matsuura (10) Patent No.: US 6,198,337 B1
(45) Date of Patent: *Mar. 6, 2001

(54) SEMICONDUCTOR DEVICE FOR OUTPUTTING A REFERENCE VOLTAGE, A CRYSTAL OSCILLATOR DEVICE COMPRISING THE SAME, AND A METHOD OF PRODUCING THE CRYSTAL OSCILLATOR DEVICE

(75) Inventor: Yoshiaki Matsuura, Chiba (JP)

(73) Assignee: A & Cmos Communications Device Inc., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/989,034

(22) Filed: Dec. 11, 1997

(30) Foreign Application Priority Data

Dec. 11, 1996 (JP) ...................................... 8-331311

(51) Int. Cl.[7] .................................................. H01M 37/76
(52) U.S. Cl. .......................... 327/525; 327/513; 327/530
(58) Field of Search .................................... 327/525, 530, 327/538, 543, 541, 512, 513; 361/728, 730

(56) References Cited

U.S. PATENT DOCUMENTS

| 4,417,263 | * | 11/1983 | Matsuura | 357/23 |
|---|---|---|---|---|
| 4,473,762 | * | 9/1984 | Iwahashi et al. | 307/594 |
| 4,547,749 | * | 10/1985 | Kuo | 331/57 |
| 4,571,709 | * | 2/1986 | Skupnjak et al. | 365/233 |
| 4,629,972 | * | 12/1986 | Briner et al. | 323/314 |
| 4,767,951 | * | 8/1988 | Cornish et al. | 307/475 |
| 4,937,474 | * | 6/1990 | Sitch | 307/448 |
| 5,173,616 | * | 12/1992 | Hinooka | 327/525 |
| 5,838,189 | * | 11/1998 | Jeon | 327/525 |

* cited by examiner

Primary Examiner—Jung Ho Kim
(74) Attorney, Agent, or Firm—Sughrue, Mion, Zinn, Macpeak & Seas, PLLC (57) ABSTRACT

A semiconductor device for outputting a reference voltage, the value of which changes depending on the ambient temperature, and a crystal oscillator device comprising the semiconductor device. The semiconductor device comprises at least one depletion MOS transistor having an overall conductivity coefficient $K_{DO}$ and at least one enhancement MOS transistor having an overall conductivity coefficient $K_{EO}$, wherein $K_{DO}$ does not equal $K_{EO}$ and the transistors are connected in series. Thus, the semiconductor device provides an output reference voltage having a predetermined temperature characteristic which can be effectively controlled in accordance with the ambient temperature. The semiconductor device is employed in a two-level housing or in a one-level housing package so that the crystal oscillator device can have a small size and is produced easily. Also disclosed is a method of producing the crystal oscillator device.

23 Claims, 10 Drawing Sheets

SEMICONDUCTOR DEVICE FOR OUTPUTTING A REFERENCE VOLTAGE, A CRYSTAL OSCILLATOR DEVICE COMPRISING THE SAME, AND A METHOD OF PRODUCING THE CRYSTAL OSCILLATOR DEVICE

FIELD OF THE INVENTION

The present invention relates to a semiconductor device for outputting a reference voltage. More particularly, the present invention relates to a semiconductor device for outputting a temperature compensated reference voltage for use in various electronic devices, a crystal oscillator device comprising the semiconductor device and a method of producing the crystal oscillator device.

BACKGROUND OF THE INVENTION

A device for outputting a constant reference voltage is conventionally used in various electronic devices as a reference voltage output device for preventing a reduction in output voltage or, for controlling the output voltage, even if the battery supply voltage is varied. The present inventor previously proposed a semiconductor device for producing a constant reference voltage despite changes in temperature and/or battery voltage as disclosed in U.S. Pat. No. 4,417,263.

Figure 5:
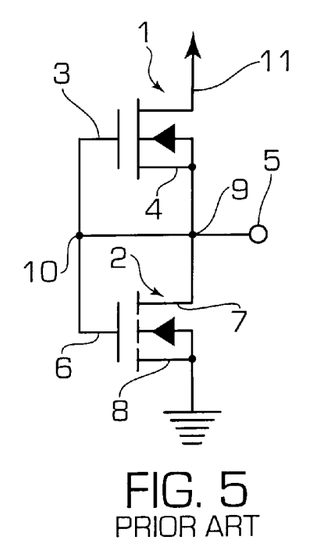
FIG. 5 shows the structure of a conventional semiconductor device for outputting a reference voltage.

The semiconductor device has the circuit shown in FIG. 5, wherein terminal 5 provides a constant voltage output at all times. N type MOS transistors 1 and 2 are connected in series. The N type MOS transistor 1 is a depletion type MOS transistor having a gate electrode 3 and a source electrode 4 which are connected together, and a P type substrate and a source electrode which are connected together. On the other hand, the N type MOS transistor 2 is an enhancement type MOS transistor having a gate electrode 6 and a drain electrode which are connected together, and a P type substrate and a source electrode 8 which are connected together.

A connecting point 10 between the gate electrode 3 of the depletion type MOS transistor 1 and the gate electrode 6 of the enhancement type MOS transistor 2 is connected to a connecting point 9 between the source electrode 4 of the depletion type MOS transistor 1 and the drain electrode 7 of the enhancement type MOS transistor 2. The drain electrode 11 of the depletion type MOS transistor 1 is connected to a high voltage supply terminal, and the source electrode 8 of the enhancement transistor 2 is connected to a low voltage supply terminal. In the above circuit, a constant reference voltage is provided at output terminal 5 connected to the connecting point 9.

Figure 6:
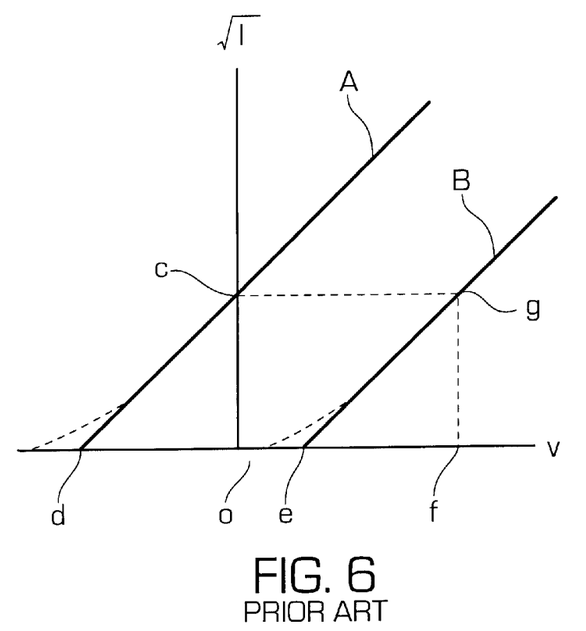
FIG. 6 is a graph showing the relationship between input voltage and input current of the semiconductor device of FIG. 5 for outputting a reference voltage.

FIG. 6 shows the relationship between electric current and voltage in the circuit of FIG. 5. In FIG. 6, line A shows drain current as a function of gate voltage of the depletion type MOS transistor 1, and line B shows drain current as a function of gate voltage of the enhancement type MOS transistor 2. In these MOS transistors, the current I between the source electrode and the drain electrode (drain current) is represented by the following equation (1) in the case of a saturated condition:

$$I = K(V_g - V_t)^2 \qquad (1)$$

wherein K, $V_g$ and $V_t$ represent a conductivity coefficient, the voltage between the source and gate (gate voltage) and the threshold voltage, respectively.

Under conditions in which the drain current I1 of the depletion type MOS transistor 1 and the drain current I2 of the enhancement type MOS transistor 2 are used in common and the voltage $V_{g1}$ between the source electrode and the gate electrode of the depletion type MOS transistor 1 is zero, the gate voltage $V_{g2}$ between the source electrode and the gate electrode, that is, the voltage output $V_C$ from the constant-voltage output terminal 5 of the enhancement type MOS transistor 2 is shown by the following equation (2):

$$V_C = -\sqrt{\frac{k1}{k2}} \cdot V_{t1} + V_{t2} \qquad (2)$$

wherein k1 and k2 are the conductivity coefficients of the depletion type MOS transistor 1 and the enhancement type MOS transistor 2, respectively, and $V_{t1}$ and $V_{t2}$ are the threshold voltages of these transistors, respectively.

In the conventional art, the conductivity coefficients of both transistors are set substantially equal (k1=k2) so that the relationship ($V_C = V_{t2} - V_{t1}$) is obtained.

In FIG. 6, c–O is the drain current I1 of the depletion type MOS transistor 1, g–f is the drain current I2 of the enhancement type MOS transistor 2, and the constant-voltage $V_C$ of the source-gate voltage of the enhancement type MOS transistor 2 is represented by the length O–f. In FIG. 6, line A and line B have the same conductivity coefficients so that the slopes of these lines are the same.

In this device, the temperature characteristic of the threshold voltage is shown as a deviation in the amount ($V_g - V_t$) in the above equation (1). In equation (1), $V_{g1} = 0$ and k1=k2 are preconditions for the above described circuit so that the quantity ($V_g - V_t$) in equation (1) is equally utilized for the depletion type MOS transistor 1 and the enhancement type MOS transistor 2. Accordingly, the output voltage of the semiconductor device is hardly changed with a change in ambient temperature.

In the above conventional art, even if the ambient temperature is changed, a constant output voltage is obtained at all times. However, it is sometimes desirable to utilize an electronic device in which there is a change in reference voltage corresponding to a change in ambient temperature. The above described technique cannot be applied in that case. In the conventional art, temperature compensation of a reference voltage corresponding to the ambient temperature is difficult to accomplish.

It is also difficult to provide an oscillator having a reference voltage output semiconductor device used for controlling the oscillation frequency of the crystal oscillator, wherein the reference voltage output changes in a predetermined manner depending on the ambient temperature.

SUMMARY OF THE INVENTION

In view of the above problems of the prior art, it is therefore an object of the present invention to provide a semiconductor device having a reference voltage output which varies in accordance with the ambient temperature.

In a first embodiment, the present invention provides a semiconductor device for outputting a reference voltage having a depletion type MOS transistor and an enhancement type MOS transistor which are connected in series. The conductivity coefficient of at least one of these transistors is variable, and the conductivity coefficients of both of the transistors are different from one another.

The value of the reference voltage output from the semiconductor device depends on the threshold voltage of the depletion type MOS transistor, the threshold voltage of the enhancement type MOS transistor, and the conductivity coefficients of both types of transistors. The temperature characteristic of the output reference voltage is obtained by differentiating the voltage value calculated from the above values with respect to temperature. The value thus obtained varies as a function of the ambient temperature. The temperature characteristic of the threshold voltage has a slope which decreases with an increase in ambient temperature. If the conductivity coefficient of the depletion type MOS transistor is less than the conductivity coefficient of the enhancement type MOS transistor, the temperature characteristic of the output reference voltage has a slope which decreases with an increase in ambient temperature.

A semiconductor device for outputting a reference voltage in accordance with a second embodiment of the present invention has the same transistors as described above. However, the conductivity coefficients of both of the transistors are variable.

A semiconductor device for outputting a reference voltage in accordance with a third embodiment of the present invention has at least one depletion type MOS transistor and at least one enhancement type MOS transistor having changeable sizes so as to adjust the respective conductivity coefficients. The term "size" as used herein means the ratio of L/W. L is adjusted by selecting a number of transistors connected in series. W is adjusted by selecting a number of transistors connected in parallel. In the present invention, L and W are changeable, for example, by cutting fuses between transistors so that the size is changeable.

A semiconductor device for outputting a reference voltage in accordance with a fourth embodiment of the present invention has a plurality of depletion type MOS transistors and enhancement type MOS transistors connected in series. The number of connected transistors can be changed, such that the conductivity coefficients of both types of transistors are easily adjusted by controlling the connections between the respective transistors. Each kind of transistor is connected in series, and the conductivity coefficient can be adjusted without increasing the electric current draw (current consumption).

A semiconductor device for outputting a reference voltage in accordance with a fifth embodiment of the present invention has a plurality of two kinds of transistors, wherein each kind of transistor is connected in parallel and the number of the connected transistors can be changed. In this manner, the conductivity coefficients can be controlled similar to the above semiconductor device. The response time of the semiconductor device is improved by connecting the plurality of transistors in parallel.

A semiconductor device for outputting a reference voltage in accordance with a sixth embodiment of the present invention has a plurality of connected transistors, wherein the overall conductivity coefficient can be changed by varying the transistor arrangement. That is, by combining the selected transistors, the overall conductivity coefficient can be changed step by step. Thus, the output reference voltage can be controlled in multiple steps with respect to the ambient temperature.

A crystal oscillator in accordance with yet another embodiment of the present invention comprises a first recess portion having provided therein a predetermined crystal oscillator, a different second recess portion having provided therein a semiconductor device for outputting a reference voltage as described in any of the above first to sixth embodiments, a first cover member for sealing the crystal oscillator in the first recess portion, and a second cover member for sealing the semiconductor device in the second recess portion.

The crystal oscillator should be hermetically sealed. In the above construction, the frequency control for the crystal oscillator can be operated after arranging the crystal oscillator in the first recess portion. For example, the frequency can be roughly controlled by evaporating metal on a surface of the crystal oscillator. Then, the first recess portion is sealed by the first cover member.

Furthermore, with regard to the semiconductor device for outputting a reference voltage, -the conductivity coefficient of the circuit can be adjusted after arranging the semiconductor device in the second recess portion. That is, at least one of the conductivity coefficients of the depletion type MOS transistor and the enhancement type MOS transistor which form the semiconductor device for outputting a reference value can be varied. The semiconductor device is arranged in the second recess portion without potting, and then the second recess portion is sealed with the second cover member.

A crystal oscillator in accordance with yet another embodiment of the present invention comprises a first recess portion and a first cover member provided on an exterior surface of the package, and a second recess portion and a second cover member provided on an opposite exterior surface of the package.

In the above construction, the crystal oscillator and the semiconductor device for outputting a reference voltage are laminated along a thickness direction of the package so that the area occupied by the package can be reduced.

The crystal oscillator in accordance with yet another embodiment of the present invention is formed by a first recess portion and a first cover member which are arranged at one side of the exterior package surface and a second recess portion and a second cover member which are arranged on the same side of the exterior package surface.

In the above construction, the thickness of the package can be reduced. Also, the volume occupied by the crystal oscillator and the semiconductor device can be reduced so that the total package volume can be reduced.

A method of producing a crystal oscillator in accordance with yet another embodiment of the present invention comprises the steps of arranging a crystal oscillator in a first recess portion, roughly controlling the frequency of the crystal oscillator arranged in the first recess portion, sealing the crystal oscillator in the first recess portion with a first cover member, arranging a semiconductor device as described in any of the above first through sixth embodiments in the second recess portion, and sealing the semiconductor device in the second recess portion with a second cover member, the method further including the step of controlling one or the both of the conductivity coefficients of the depletion type MOS transistor and the enhancement type MOS transistor of the semiconductor device arranged in the second recess portion.

In this method, after arranging the semiconductor device for outputting a reference voltage in the second recess portion, the conductivity coefficient can be adjusted. That is, after arranging the semiconductor device, an operation is carried out so as to provide an output reference voltage having a desired temperature characteristic. The second recess portion has an upper opening portion so that the conductivity coefficient of the arranged semiconductor device can be adjusted using a laser beam from the upper opening.

In a method for producing a crystal oscillator in accordance with yet another embodiment of the present invention, the number of one or both of the connected depletion type MOS transistors and the connected enhancement type MOS transistors is changed by cutting lines with a laser beam in a step of adjusting the conductivity coefficient of one or the both of the depletion type MOS transistors and the enhancement type MOS transistors of the semiconductor device, and each line connects one transistor with an adjacent transistor.

It is unnecessary to arrange a crystal oscillator in the first recess portion before installing a semiconductor device into the second recess portion. When the crystal oscillator is roughly adjusted, the semiconductor device need not be present in the second recess.

In this method, the conductivity coefficient of each transistor can be easily adjusted. Thus, a method for producing a crystal oscillator having a temperature compensated semiconductor device for outputting a reference voltage is easily accomplished.

DESCRIPTION OF THE PREFERRED EMBODIMENTS

The present invention is described in greater detail below by reference to the accompanying drawings.

Figure 1:
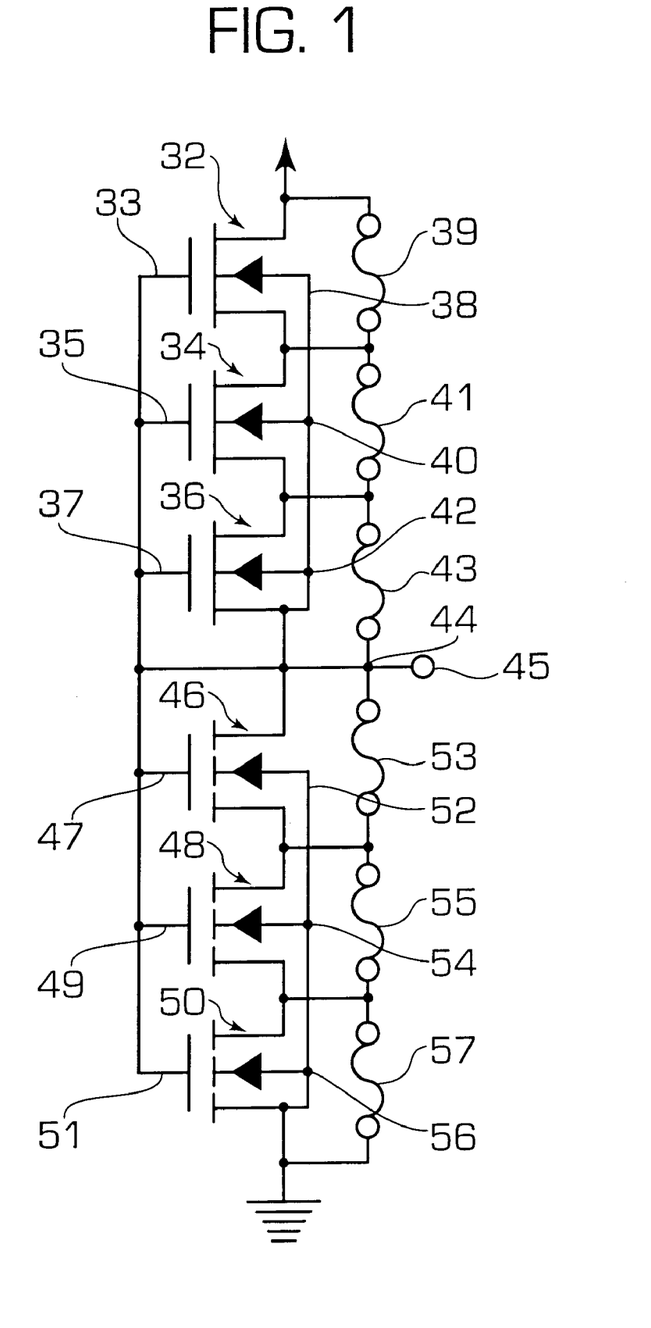
FIG. 1 shows the structure of a semiconductor device of an embodiment according to the present invention.

FIG. 1 shows the structure of a first embodiment of a semiconductor device of the present invention for outputting a reference voltage. As shown in FIG. 1, three depletion type MOS transistors and three enhancement type MOS transistors are connected in series, respectively. Regarding the three depletion type MOS transistors 32, 34 and 36, the source and drain electrodes of each of these transistors are connected in parallel to the fuses 39, 41 and 43, respectively. The fuses 39, 41 and 43 are connected in series.

Regarding the enhancement type MOS transistors 46, 48 and 50, the source and drain electrodes of each of these transistors are connected in parallel to the fuses 53, 55 and 57, respectively. The fuses 53, 55 and 57 are connected in series. A reference voltage is output from an output terminal 45 connected to an intermediate point 44 between the depletion type MOS transistors and the enhancement type MOS transistors.

In the above structure, the transistors are connected and added to the circuit by cutting the respective fuses. Accordingly, the number of transistors that are connected is controlled by cutting fuses so that the overall conductivity coefficient of the depletion type MOS transistors is made different from the overall conductivity coefficient of the enhancement type MOS transistors. If the conductivity coefficients of the individually connected depletion type MOS transistors are all the same, the overall conductivity coefficient can be controlled by changing the number of connected transistors. By increasing the number of connected and controlling transistors, the overall conductivity coefficient can be decreased, and the overall conductivity coefficient can be increased by decreasing the number of connecting and controlling transistors.

In FIG. 1, a voltage source (e.g., a high voltage supply battery) is connected to a drain electrode 32 of the upper depletion type MOS transistor, and the source electrode of the lower enhancement type MOS transistor is connected to ground (or a low voltage supply).

Instead of a fuse, an ON/OFF switching element such as a solid state transistor switch can be used to control the conductivity coefficients after arranging the semiconductor device.

Each substrate 38, 40 and 42 of the depletion type MOS transistors and each substrate 52, 54 and 56 of the enhancement type MOS transistors is connected to the reference voltage output terminal 45. Each gate electrode 33, 35, 37, 47, 49 and 51 is also connected to the reference voltage output terminal 45.

The respective conductivity coefficients of the depletion type MOS transistors and the enhancement type MOS transistors need not have the same value. For example, it is possible for a first transistor, a second transistor and a third transistor to have a conductivity coefficient of X, 2X and 4X, respectively. In this manner, the conductivity coefficients can be divided into seven steps.

Figure 2:
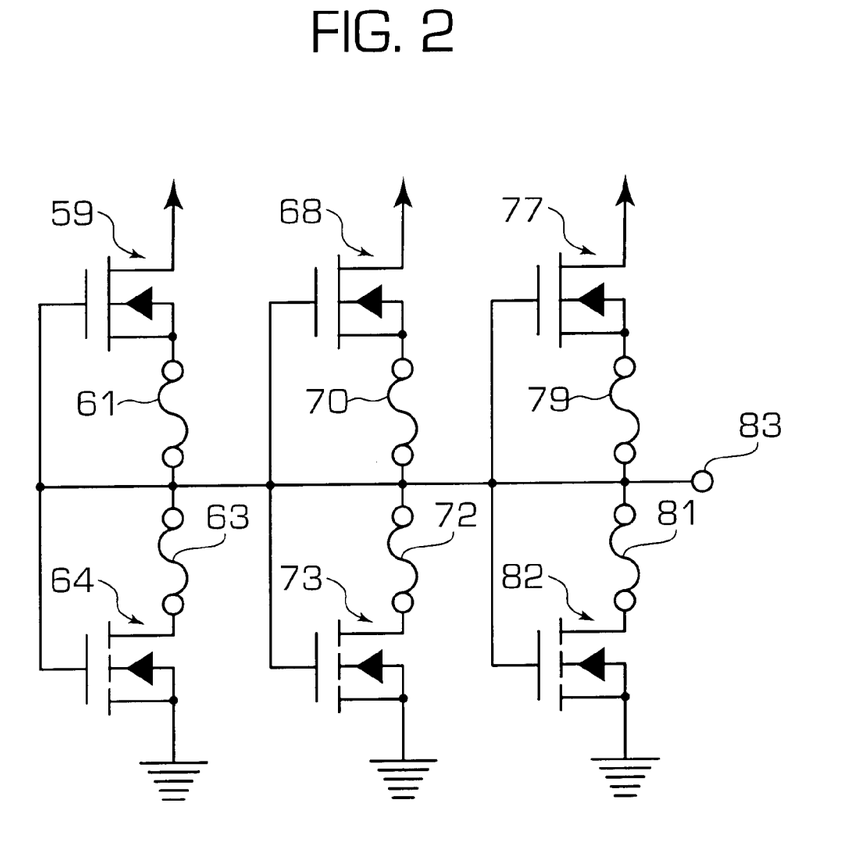
FIG. 2 shows the structure of a semiconductor device of another embodiment according to the present invention.

FIG. 2 shows another embodiment of the present invention. As shown in FIG. 2, three depletion type MOS transistors 59, 68 and 77 are connected in parallel and each of three enhancement type MOS transistors 64, 73 and 82 are connected in parallel. The drain electrodes of each of the depletion type MOS transistors 59, 68 and 77 are connected to fuses 61, 70 and 79, respectively. On the other hand, the drain electrodes of each of the enhancement type MOS transistors 64, 73 and 82 are connected to fuses 63, 72 and 81, respectively. Any of the transistors can be set to a non-connecting condition by cutting its corresponding fuse. In this manner, the overall conductivity coefficient of the depletion type MOS transistors and the enhancement type MOS transistors can be controlled by cutting fuses. Similar to the device shown in FIG. 5, a reference voltage is output from a reference voltage output terminal 83 leading from a connecting line between a group of the depletion type MOS transistors and a group of the enhancement type MOS transistors.

The device in which the transistors are connected in series as shown in FIG. 1 is useful when it is desirable to minimize electric current consumption because this device does not draw increased current as additional transistors are connected. On the other hand, when response time is more important than current consumption, the device of FIG. 2 in which the transistors are connected in parallel is preferable. In this device, it is also possible for a first transistor, a second transistor and a third transistor to have a conductivity coefficient of X, 2X and 4X, respectively, similar to the device shown in FIG. 1.

Figure 3A:
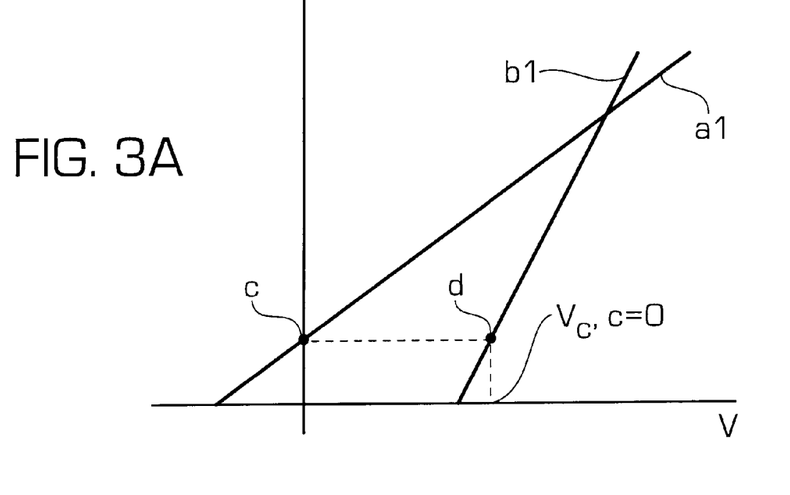
FIG. 3A shows current as a function of gate voltage for each of the depletion and enhancement transistors.
Figure 4A:
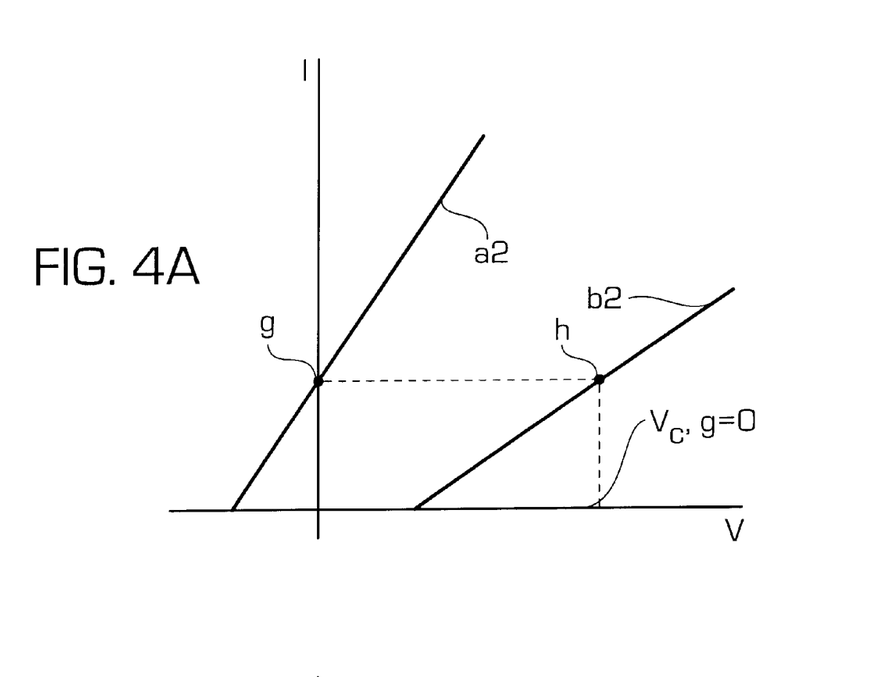
FIG. 4A shows current as a function of gate voltage for each of the depletion and enhancement transistors.

FIGS. 3A and 4A show the relationship between the drain current and gate voltage of each transistor when the conductivity coefficient $K_D$ of the depletion type MOS transistor and the conductivity coefficient $K_E$ of the enhancement type MOS transistor are made different from each other. In FIG. 3A, the conductivity coefficient $K_D$ is less than the conductivity coefficient $K_E$. In FIG. 4A, the conductivity coefficient $K_D$ is larger than the conductivity coefficient $K_E$.

Compared to the conventional relationship shown in FIG. 6, each of the sloped lines a and b corresponding to the depletion type MOS transistor and the enhancement type MOS transistor are different from each other.

In FIG. 3A, point c on line a1 of the depletion type MOS transistor shows the source-drain current when the source-gate voltage of the depletion type MOS transistor is zero. Point d on line b1 of the enhancement type MOS transistor shows a source-gate voltage, that is, the reference voltage $V_C$ when point c is zero.

In FIG. 4A, point g on line a2 of the depletion type MOS transistor shows the source-drain current when the source-gate voltage of the depletion type MOS transistor is zero. Point h on line b2 of the enhancement type MOS transistor shows a source-gate voltage, that is, the reference voltage $V_C$ when point g is zero.

In FIGS. 3A and 4A, $K_E$ and $K_D$ are the conductivity coefficients of the enhancement type MOS transistor and the depletion type MOS transistor, respectively. $V_{TE}$ and $V_{TD}$ are the threshold voltages of the enhancement type MOS transistor and the depletion type MOS transistor, respectively.

The above output reference voltage $V_C$ can be obtained from equation (2) above. The value obtained from this equation is differentiated with respect to temperature T in accordance with the following equation (3), so that the temperature characteristic of the reference output voltage $V_C$ can be obtained.

$$\frac{\partial V_c}{\partial T} = \frac{\partial V_{TE}}{\partial T} - \sqrt{\frac{K_D}{K_E}} \frac{\partial V_{TD}}{\partial T} - \frac{V_{TD}}{2} \sqrt{\frac{K_D}{K_E}} \left( \frac{1}{K_D} \frac{\partial K_D}{\partial T} - \frac{1}{K_E} \frac{\partial K_E}{\partial T} \right) \quad (3)$$

Figure 3B:
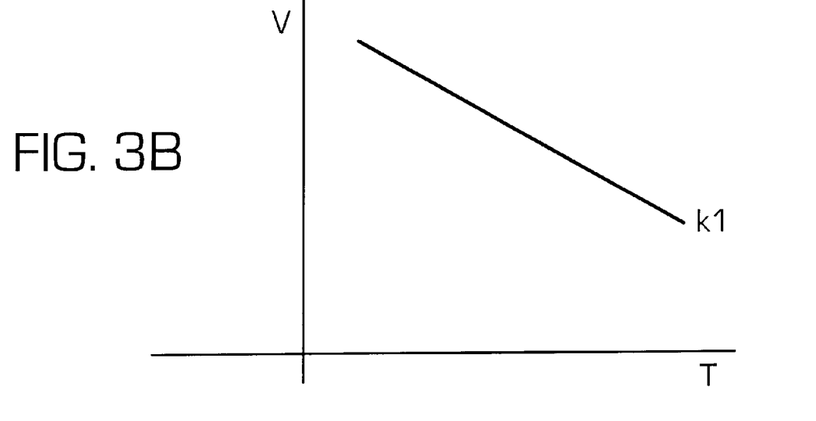
FIG. 3B is a graph showing the temperature characteristic of the output reference voltage in one embodiment of the present invention.
Figure 4B:
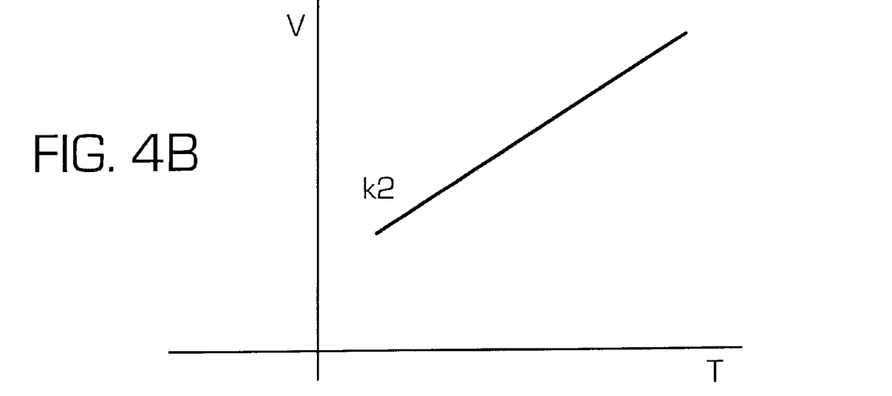
FIG. 4B is a graph showing the temperature characteristic of the output reference voltage in another embodiment of the present invention.

The temperature characteristic of the output reference voltage is shown in FIGS. 3B and 4B. When the conductivity coefficient $K_D$ is less than the conductivity coefficient $K_E$, the temperature characteristic of the threshold voltage decreases with an increase in temperature. Consequently, the temperature characteristic of the output reference voltage $V_C$ decreases with an increase in temperature as shown by line k1 in FIG. 3B. On the other hand, when the conductivity coefficient $K_D$ is larger than the conductivity coefficient $K_E$, the temperature characteristic of the output reference voltage $V_C$ increases with an increase in temperature as shown in by line k2 in FIG. 4B.

As described above, a desired reference voltage corresponding to a desired temperature characteristic can be obtained by controlling the conductivity coefficients of the depletion type MOS transistor and the enhancement type MOS transistor.

Figure 7:
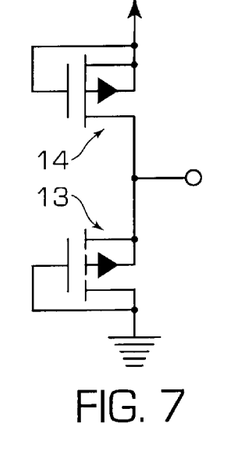
FIG. 7 shows another structure in accordance with the present invention.
Figure 8:
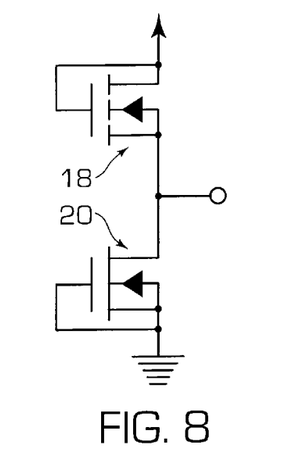
FIG. 8 shows another structure in accordance with the present invention.
Figure 9:
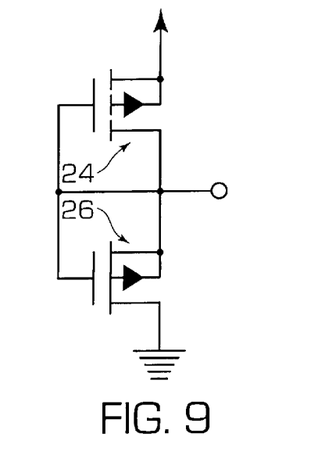
FIG. 9 shows another structure in accordance with the present invention.

The circuits shown in FIGS. 1 and 2 are applicable to the transistor connections in the devices shown in FIGS. 7, 8 and 9. In this manner, a reference voltage having a predetermined temperature characteristic can be obtained.

FIG. 7 shows a structure similar to that of FIG. 5, however, a P type MOS transistor is used. The gate electrode and the source electrode of the depletion type MOS transistor 12 are connected together, and the gate electrode and the drain electrode of the enhancement type MOS transistor 13 are connected together. FIG. 8 shows another embodiment of the present invention, in which an N type MOS transistor is used in a manner similar to the embodiment of FIG. 5. In the enhancement type MOS transistor 18, the gate electrode and drain electrode are connected to a voltage source (e.g., a high voltage battery supply). In the depletion type MOS transistor 20, the gate electrode and source electrode are connected to a low voltage battery supply (ground). The transistors are connected in series. A reference voltage is output from a terminal connecting the source of transistor 18 and the drain of transistor 20. FIG. 9 shows another embodiment employing P type MOS transistors 24 and 26.

The above MOS transistor circuits which are modifications of the embodiments shown in FIGS. 1 and 2 provide a similar effect.

Figure 10A:
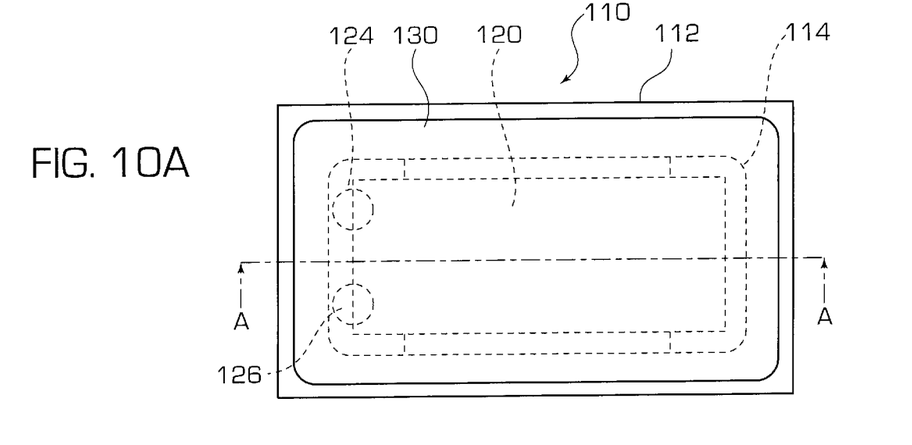
FIGS. 10A, 10B and 10C show three views of a crystal oscillator device according to one embodiment of the present invention.
Figure 10B:
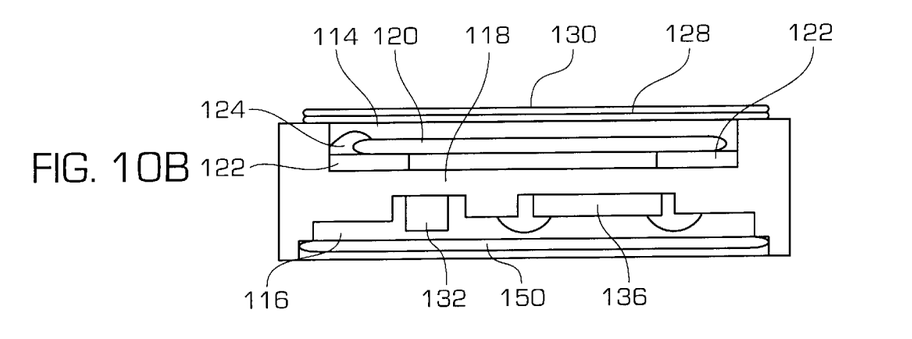
Figure 10C:
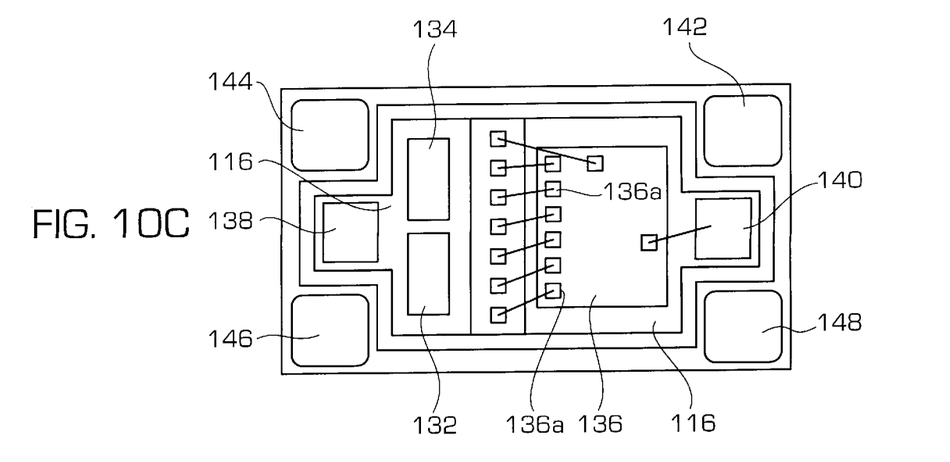
Figure 11A:
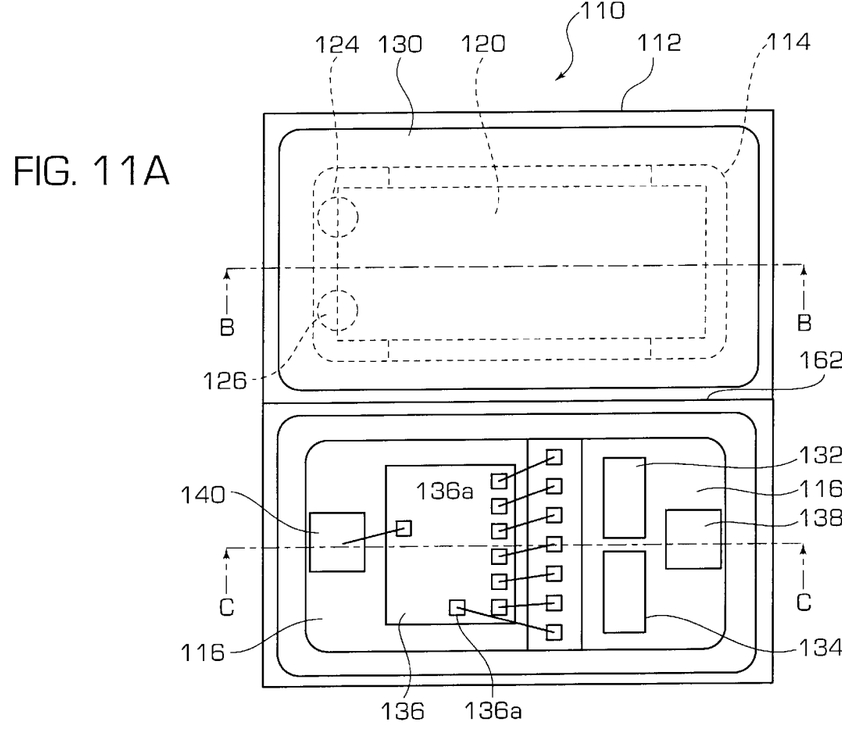
FIGS. 11A, 11B and 11C show another embodiment of a crystal oscillator device according to the present invention.
Figure 11B:
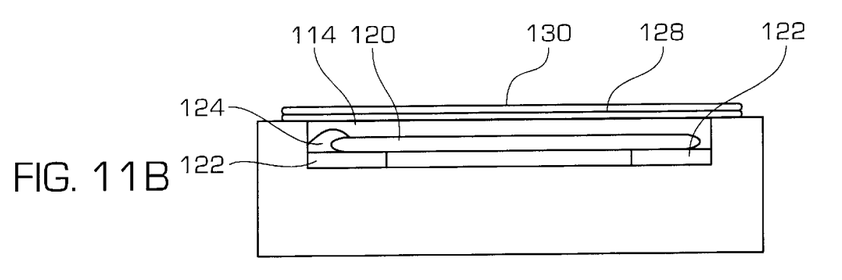
Figure 11C:
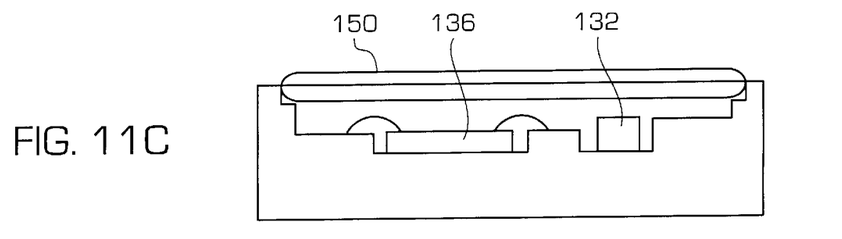

Next, a crystal oscillator device with the above described semiconductor device for outputting a reference voltage is described in detail below with reference to the accompanying drawings. FIGS. 10A to 10C show one embodiment of a crystal oscillator device having a package of the present invention.

FIGS. 10A, 10B and 10C are a plane view, a cross sectional view taken along line A—A and a back side view of a crystal oscillator device 110 of the present invention, respectively. As shown in these drawings, the package 112 has a two-level housing. A first recess 114 is formed in a first surface of the package and a second recess 116 is formed in an opposite surface. An intermediate layer 118 is provided between recesses 114 and 116.

In the first recess 114, a crystal oscillator 120 is mounted on a substrate 122 made of, for example, ceramic. Electrodes 124 and 126 of the crystal oscillator 120 are soldered or welded. The electrodes 124, 126 are electrically connected to a semiconductor device mounted in the second recess 116 through the intermediate layer 118. An outer peripheral top surface surrounding the first recess 114 in which the crystal oscillator 120 is mounted is sealed with a guard ring 128 and a metal cap 130. Thereby, the crystal oscillator 120 is hermetically sealed in the first recess 114. A hermetic seal is preferable for operation of the crystal oscillator 120.

In the crystal oscillator device 110 mounted as described above, the frequency of the crystal oscillator 120 is adjusted before sealing with the metal cap 130. For example, metal can be evaporated on a surface of the crystal oscillator 120 under vacuum in order to roughly control the frequency. The frequency is controlled by measuring with electrode probes standing on the electrodes 138, 140 in the second recess as described below. That is, when a frequency of the crystal oscillator 120 is roughly adjusted, metal is evaporated on electrodes 138, 140 in order to delay the frequency by standing on electrode probes on the electrodes 138, 140.

Installed in the second recess formed in the opposite surface of the package are a semiconductor device for outputting a reference voltage, that is, a semiconductor device 136 for outputting a reference voltage having a desired temperature characteristic, bypass condensers 132, 134 and electrodes 138, 140. Also, electrodes 142, 144, 146 and 148 are provided at each corner of the outer periphery portion of the second recess 116, respectively.

Before mounting the semiconductor device 136, the bypass condensers 132, 134 are mounted and then the semiconductor device 136 is die-bonded in the second recess 116. Each terminal 136a of the semiconductor device 136 is connected by die-bonding. After that, the crystal oscillator device 110 is operable. However, if the crystal oscillator device 110 is used as a temperature compensated crystal oscillator (TCXO) for a mobile phone, an additional operation is necessary to make the central frequency of the crystal oscillator 120 coincide with the temperature characteristic.

For example, in the case of the semiconductor device for outputting a reference voltage as shown in FIGS. 1 and 2, the conductivity coefficient(s) which is/are varied by the capacity of a condenser in the semiconductor device and/or controlling a voltage value in a constant-voltage circuit is/are controlled by cutting fuses with a laser beam in order to obtain a desired temperature characteristic. In this manner, the control characteristic of the semiconductor device 136 is made suitable for a specific crystal oscillator 120.

After setting the temperature characteristic, the second recess 116 is covered with a cap 150 made of resin or metal from the upper opening. This is done in order to seal the semiconductor device 136 for outputting a reference voltage in the second recess 116 without changing the temperature characteristic. In a method for sealing a cover surface of the semiconductor device 136 by potting, the cap 150 is used to avoid changing the temperature characteristic by covering an exposed surface of the semiconductor device 136. Thus, in accordance with package 112 of the crystal oscillator device 110 of the present invention, a portion above the mounted semiconductor device 136 is released so that the conductivity coefficients can be controlled. After setting the same, the semiconductor device 136 is sealed with the cap 150 in order to maintain the temperature characteristic.

Another embodiment of the crystal oscillator device 110 is described with reference to FIGS. 11A, 11B and 11C and FIG. 12. In comparing FIG. 1 with the embodiments shown in the above drawings, the same numerals are used to refer to corresponding structures.

Figure 12:
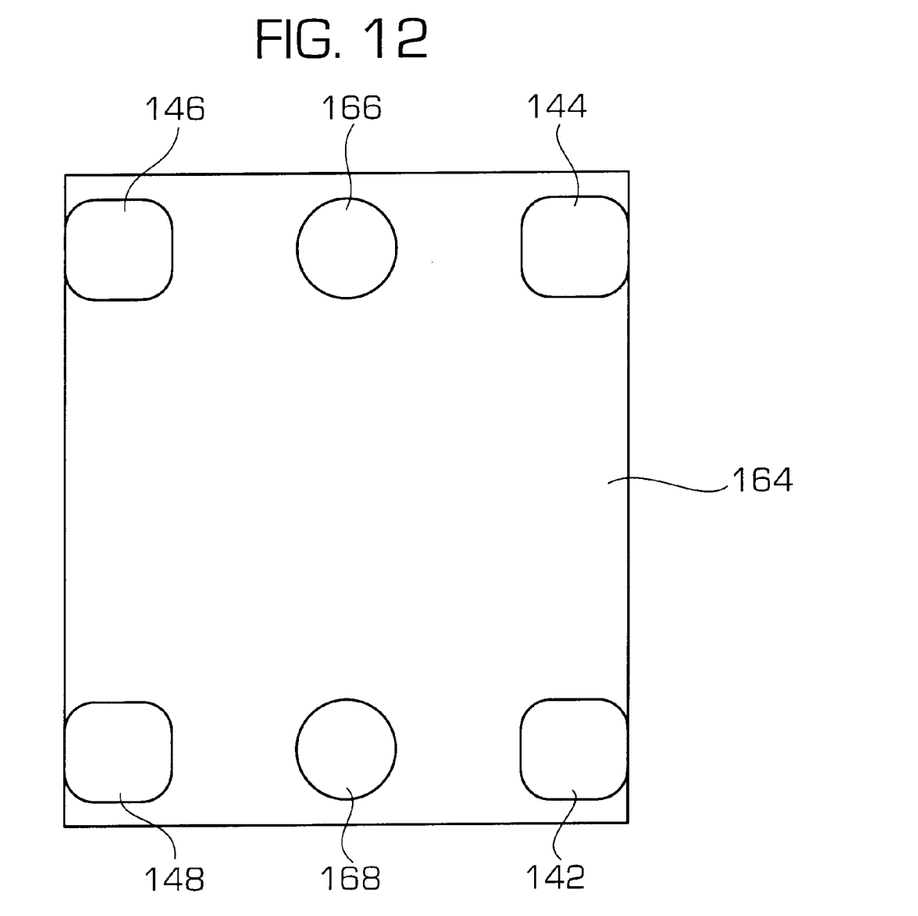
FIG. 12 shows a backside view of the crystal oscillator device of FIGS. 11A–11C.

In this embodiment of the present invention, a single-level housing structure is employed different from the two-level housing such as the package 112 shown in FIG. 10B. That is, two recesses, including a first recess 114 and a second recess 116, are juxtaposed on a surface. A partition wall 162 is provided between the first recess 114 and the second recess 116. As shown in FIG. 12, a common bottom portion 164 is formed.

The inside elements mounted in each recess are the same as shown in FIG. 10C. The shape of the second recess 116 as shown in FIG. 12 is different from that shown in FIG. 10C, because a space for normal electrodes 142 through 148 is provided at the same plane on which the second recess 116 is formed.

According to the single-level housing structure, the package can be made thin. That is, the package having a thickness of from 1.0 mm to 1.3 mm is thinner than a conventional package. In this embodiment of the present invention, the size of the package 160 is 5 mm×7 mm×1.0 mm to 1.3 mm. Therefore, the package of the present invention is well adapted for use in a mobile phone and in a card-type device having a thickness of less than 2.0 mm.

In FIG. 12, numerals 166 and 168 show electrodes for measuring the characteristics of the crystal oscillator 120. The generating frequency of the crystal oscillator 120 is controlled before mounting the semiconductor device 136 in the adjusting operation.

In a method of producing the crystal oscillator device 110, the crystal oscillator 120 is mounted in the second recess 114, the generating frequency of the mounted crystal oscillator 120 is roughly controlled, and then the cap 130 seals the first recess 114 from the upper opening. Thus, the crystal oscillator 120 is sealed in the first recess 114.

Next, the semiconductor device 136 is mounted in the second recess 116. The conductivity coefficient(s) of one or both of the depletion type MOS transistor and the enhancement type MOS transistor is/are controlled by cutting fuses with a laser beam in order to control the number of connected transistors. The semiconductor device 136 is not sealed by potting. The second recess 116 is sealed with the cap 150 from the upper opening such that the semiconductor device 136 can be sealed in the second recess 116. In accordance with the above described process of producing a crystal oscillator device, the crystal oscillator 120 and the semiconductor device 136 can be controlled after mounting the crystal oscillator 120 and the semiconductor device 136 in the first and second recesses 114 and 116, respectively. Because the semiconductor device 136 can be accessed from the upward opening, the temperature compensation control is easily accomplished which is an advantage of the present invention.

Figure 13:
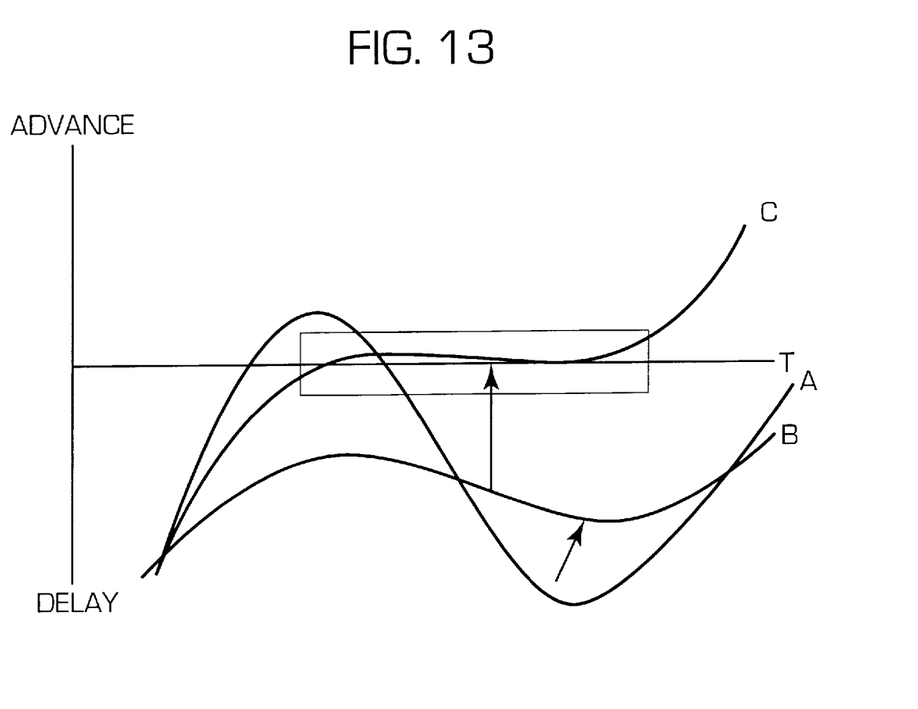
FIG. 13 shows the relationship between frequency delay/advance of the crystal oscillator and temperature T.

FIG. 13 shows the relationship between frequency delay/advance and temperature T. Initially, the central frequency at 25° C. is delayed as shown by curve A after roughly adjusting the same. Thus, the frequency curve A is changed to curve B. Then, the curve B is adjusted to curve C. Part of the curve C passes through a predetermined area corresponding to a temperature characteristic of the crystal oscillator. These adjustments are carried out by controlling the semiconductor device for outputting a reference voltage with a conventional method. In other words, the frequency curve is controlled to pass through a predetermined area corresponding to a temperature characteristic of the crystal oscillator.

More particularly, as indicated in FIG. 13, the semiconductor device for outputting a reference voltage interacts to control the crystal oscillator. Namely, the semiconductor device is used to adjust the relationship between the frequency of the crystal oscillator and its temperature characteristic, that is, by changing/moving curve A to curve C.

The present invention is not restricted to the above described embodiments. Various modifications are available without changing the essence of the present invention. For example, although the embodiments of FIGS. 1 and 2 show structures wherein a plurality of both depletion type MOS transistors and enhancement type MOS transistors are connected in series or parallel, respectively, one of the transistor types may comprise a single transistor and/or have a variable conductivity coefficient. By changing the ratio of the conductivity coefficient of one of the transistor types with respect to the other conductivity coefficient, a reference voltage having the desired temperature characteristic can be obtained.

With regard to the method of changing the conductivity coefficients, other methods, for example, a method of controlling the distance between the source electrode and drain electrode of each transistor and a method of controlling the distance between the source electrode and a drain electrode may also be used.

In the present invention, the overall ratio of $K_D/K_E$ and $K_E/K_D$ are preferably from 1:1.1 to 1:100.

As described above, according to a semiconductor device for outputting a reference voltage of the present invention, one or both of the respective conductivity coefficients of the connected depletion type MOS transistor and enhancement type MOS transistor is controlled such that they are different from each other at all times. Thereby, the voltage output value can be changed as a function of temperature, that is, a reference voltage with a desired temperature characteristic can be obtained. Accordingly, the reference voltage is controlled with a change in ambient temperature so that a semiconductor device for outputting a reference voltage can be utilized in various fields.

By producing a two-level housing and a one-level housing package for a crystal oscillator with the above semiconductor device for outputting a reference voltage, the crystal oscillator device is simplified and can assume a small size.

It should further be apparent to those skilled in the art that various changes in form and detail of the invention as shown and described above may be made. It is intended that such changes be included within the spirit and scope of the claims appended hereto.

What is claimed is:

1. a semiconductor device for outputting a reference voltage which varies with ambient temperature, comprising:

at least one depletion MOS transistor having an overall conductivity coefficient $K_{DO}$ and gate and source electrodes which are connected together, and at least one enhancement MOS transistor having an overall conductivity coefficient $K_{EO}$ and gate and drain electrodes which are connected together, wherein a total number of said depletion and enhancement MOS transistors is at least three, wherein at least one depletion MOS transistor and at least one enhancement MOS transistor are connected in series, and wherein;

when a voltage source is connected between a drain electrode of at least one of said depletion MOS transistors and a source electrode of at least one of said enhancement MOS transistors, a predetermined reference voltage is output from an intermediate connection point, and wherein means are provided for varying at least one of said overall conductivity coefficients in order to provide said predetermined reference voltage with a desired temperature characteristic.

2. The semiconductor device as claimed in claim 1, wherein said intermediate point connects a source electrode of said at least one depletion MOS transistor and a drain electrode of said at least one enhancement MOS transistor.

3. The semiconductor device as claimed in claim 1, wherein said at least one depletion MOS transistor comprises two or more transistors connected in series and said at least one enhancement MOS transistor comprises two or more transistors connected in series.

4. The semiconductor device as claimed in claim 1, wherein said at least one depletion MOS transistor comprises two or more transistors connected in parallel and said at least one enhancement MOS transistor comprises two or more transistors connected in parallel.

5. The semiconductor device as claimed in claim 1, wherein one of $K_{DO}$ and $K_{EO}$ is set by either varying the conductivity coefficient of one or more of said depletion and enhancement MOS transistors or by electrically disconnecting one or more of said depletion and enhancement MOS transistors.

6. The semiconductor device as claimed in claim 1, wherein both of $K_{DO}$ and $K_{EO}$ are set by either varying the conductivity coefficient of one or more of said depletion and enhancement MOS transistors or by electrically disconnecting one or more of said depletion and enhancement MOS transistors.

7. The semiconductor device as claimed in claim 1, wherein the conductivity coefficients of one or more of the transistors constituting said at least one depletion MOS transistor are different from the conductivity coefficients of one or more of the transistors constituting said at least one enhancement MOS transistor.

8. The semiconductor device as claimed in claim 1, wherein the number of transistors constituting said at least one depletion MOS transistor is different from the number of transistors constituting said at least one enhancement MOS transistor.

9. The semiconductor device as claimed in claim 1, wherein said at least one depletion MOS transistor comprises two or more transistors, said at least one enhancement MOS transistor comprises two or more transistors, and at least one of said depletion and enhancement MOS transistors are electrically disconnected from the semiconductor device such that the number of electrically connected depletion MOS transistors is different from the number of electrically connected enhancement MOS transistors.

10. The semiconductor device of claim 1, wherein said at least one depletion MOS transistor and said at least one enhancement MOS transistor are of the same conductivity type.

11. The semiconductor device of claim 1, wherein $K_{DO}$ is greater than $K_{EO}$.

12. The semiconductor device of claim 1, wherein $K_{EO}$ is greater than $K_{DO}$.

13. The semiconductor device of claim 1, wherein said reference voltage output varies as a function of ambient temperature.

14. A crystal oscillator device comprising a package including:

a first recess comprising a crystal oscillator, a second recess comprising a semiconductor device for outputting a reference voltage, a first cover member for sealing the crystal oscillator in the first recess, and a second cover member for sealing the semiconductor device in the second recess, wherein said semiconductor device comprises:

at least one depletion MOS transistor having an overall conductivity coefficient $K_{DO}$ and a gate electrode and a source electrode which are connected together, and at least one enhancement MOS transistor having an overall conductivity coefficient $K_{EO}$ and a gate electrode and a drain electrode which are connected together, wherein the at least one depletion MOS transistor and the at least one enhancement MOS transistor are connected in series, when a voltage source is connected between a drain electrode of said at least one depletion MOS transistor and a source electrode of said at least one enhancement MOS transistor, a predetermined reference voltage is output from an intermediate point connecting the at least one depletion MOS transistor and the at least one enhancement MOS transistor, and $K_{DO}$ does not equal $K_{EO}$.

15. The crystal oscillator device as claimed in claim 14, wherein the first recess and the first cover member are provided on an exterior surface of the package and the second recess and the second cover member are provided on an opposite exterior surface of the package.

16. The crystal oscillator device as claimed in claim 14, wherein the first recess and the first cover member and the second recess and the second cover member are provided on the same exterior surface of the package.

17. The crystal oscillator device as claimed in claim 14, wherein said reference voltage output varies as a function of ambient temperature.

18. A method of producing a crystal oscillator device comprising a package, said method comprising the steps of:

arranging a crystal oscillator having an oscillation frequency in a first recess of said package, adjusting the frequency of the crystal oscillator, sealing the crystal oscillator in the first recess with a first cover member, arranging a semiconductor device for outputting a reference voltage in a second recess of said package, and sealing the semiconductor device in the second recess with a second cover member, wherein said semiconductor device comprises:

at least one depletion MOS transistor having an overall conductivity coefficient $K_{DO}$ and a gate electrode and a source electrode which are connected together, and at least one enhancement MOS transistor having an overall conductivity coefficient $K_{EO}$ and a gate electrode and a drain electrode which are connected together, wherein the at least one depletion MOS transistor and the at least one enhancement MOS transistor are connected in series, when a voltage source is connected between a drain electrode of said at least one depletion MOS transistor and a source electrode of said at least one enhancement MOS transistor, a predetermined reference voltage is output from an intermediate point connecting the at least one depletion MOS transistor and the at least one enhancement MOS transistor, and $K_{DO}$ does not equal $K_{EO}$.

19. The method of claim 18, which comprises adjusting one or both of $K_{DO}$ and $K_{EO}$ by varying the conductivity coefficient of one or more of said depletion and enhancement MOS transistors.

20. The method of claim 18, which comprises adjusting one or both of $K_{DO}$ and $K_{EO}$ by electrically disconnecting one or more of said depletion and enhancement MOS transistors.

21. The method of claim 18, which comprises providing said first recess and said first cover member on an exterior surface of the package and providing said second recess and said second cover member on an opposite exterior surface of the package.

22. The method of claim 18, which comprises providing said first and second recesses and said first and second cover members on the same exterior surface of the package.

23. The method of claim 18, wherein said reference voltage output varies as a function of ambient temperature.

\* \* \* \* \*